(12) United States Patent
Takano et al.

(10) Patent No.: US 8,711,053 B2
(45) Date of Patent: Apr. 29, 2014

(54) ANTENNA DEVICE (75) Inventors: Toshiyuki Takano, Ishikawa (JP);
Yutaka Saito, Ishikawa (JP); Masayuki Obata, Ishikawa (JP)

(73) Assignee: Panasonic Corporation, Osaka (JP)

( * ) Notice: Subject to any disclaimer, the term of this patent is extended or adjusted under 35 U.S.C. 154(b) by 467 days.

(21) Appl. No.: 13/131,093

(22) PCT Filed: Oct. 6, 2010

(86) PCT No.: PCT/JP2010/005989
§ 371 (c)(1),
(2), (4) Date: May 25, 2011

(87) PCT Pub. No.: WO2011/048762
PCT Pub. Date: Apr. 28, 2011

(65) Prior Publication Data
US 2011/0227808 A1 Sep. 22, 2011

(30) Foreign Application Priority Data
Oct. 21, 2009 (JP) .................................. 2009-242575

(51) Int. Cl.
*H01Q 1/50* (2006.01)
(52) U.S. Cl.
USPC ......................................... 343/906; 343/907
(58) Field of Classification Search
USPC ......................................... 343/906, 907, 908
See application file for complete search history.

(56) References Cited

U.S. PATENT DOCUMENTS

| 7,786,943 | B2 | 8/2010 | Deguchi |
| 7,839,350 | B2 | 11/2010 | Nagai |
| 7,903,030 | B2 | 3/2011 | Nagai |
| 7,990,326 | B2 | 8/2011 | Nakamura et al. |
| 2004/0026519 | A1 | 2/2004 | Usami et al. |
| 2007/0183515 | A1 | 8/2007 | Lim et al. |
| 2009/0051620 | A1 | 2/2009 | Ishibashi et al. |
| 2009/0153433 | A1 | 6/2009 | Nagai et al. |
| 2010/0201586 | A1* | 8/2010 | Michalk ........................ 343/741 |

FOREIGN PATENT DOCUMENTS

| JP | 63-254804 | 10/1988 |
| JP | 07-318612 | 12/1995 |
| JP | 2000-196327 | 7/2000 |
| JP | 2004-127230 | 4/2004 |
| JP | 2006-262414 | 9/2006 |
| WO | 2006/106982 | 10/2006 |

* cited by examiner

*Primary Examiner* — Ahshik Kim
(74) *Attorney, Agent, or Firm* — Greenblum & Bernstein, P.L.C.

(57) ABSTRACT

Provided is an antenna device, having a small and simple configuration, which reduces connection resistance in connections between a film antenna element and a power feeding unit. An antenna device comprises a nonconductive transparent film, which is an insulating substrate having a prescribed optical transmission factor, an antenna element that is formed, upon the transparent film, from transparent conductive material, which is a conductive material having a prescribed optical transmission factor, and a non-transparent conductive power feeding wire. The transparent film and the transparent conductive material are doubled over and pressed upon a portion of one side of the antenna element, which forms a square dipole antenna, such that the transparent conductive material is on the inside, and the power feeding wire is sandwiched therein. By being doubled over, the transparent conductive material has an overlap portion, the two sides whereof electrically connect to one other.

2 Claims, 6 Drawing Sheets

FIG.1A

PRIOR ART

FIG.1B

PRIOR ART

FIG.2

PRIOR ART

ANTENNA DEVICE

TECHNICAL FIELD

The present invention relates to an antenna apparatus using a film-like antenna element.

BACKGROUND ART

In recent years, proposal has been made to form an antenna element with a transparent conductive material formed on a non-conductive transparent film as an antenna apparatus that can be attached to glass of vehicles, stores, or offices, for example, and that does not impair the view and design. The transparent conductive material formed on the transparent film cannot be connected by soldering due to its low heat resistance. Therefore, a power feeding structure between a transparent conductive material and a power feed line, a metal conductor, is under consideration.

Figure 1A:
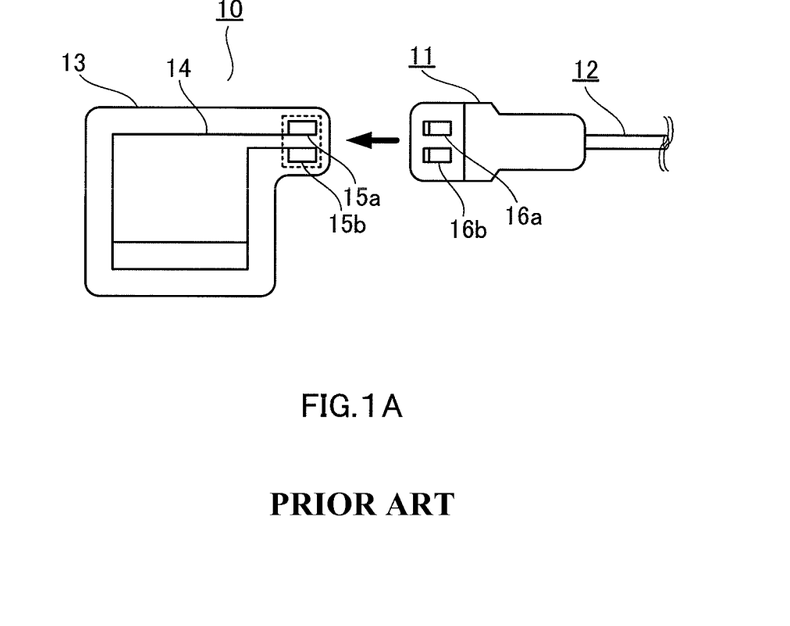
FIGS. 1A and 1B show a configuration of the antenna apparatus disclosed in Patent Literature 1 which is prior art.
Figure 1B:
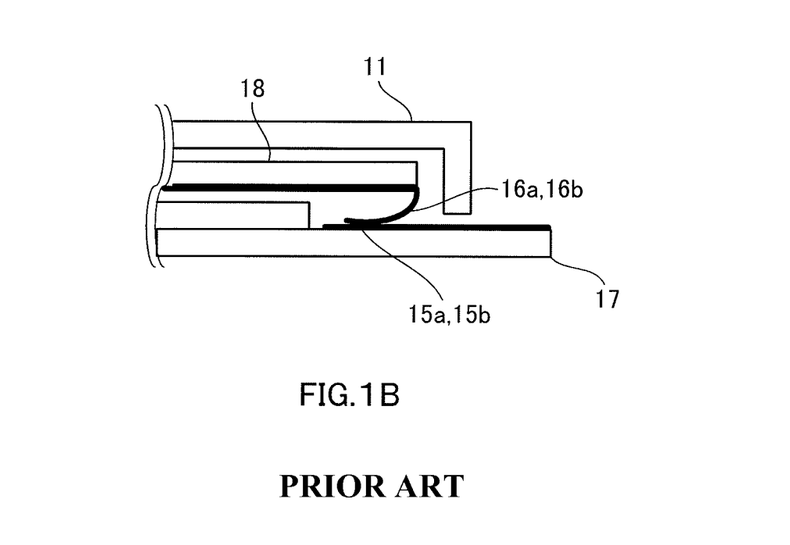

As an example of such a power feeding structure other than soldering, the antenna apparatus disclosed in Patent Literature 1 has been proposed, for example. FIG. 1 shows a configuration of the antenna apparatus disclosed in Patent Literature 1. FIG. 1A is a plan view showing a state in which antenna body 10 and connecting apparatus 11 and power feed line 12 are divided into two, and FIG. 1B is a cross sectional view of antenna body 10 and connecting apparatus 11 that are mounted on window glass 17.

Antenna body 10 is configured such that antenna element 14 is formed on antenna element holding sheet 13, and connection terminals 15a and 15b of the antenna element are provided. Connecting apparatus 11 is provided with wiring substrate 18 in which a low-noise amplifier, for example, is mounted, and one side of wiring substrate 18 is connected to power feed line 12 and the other side of wiring substrate 18 is connected to connection terminals 16a and 16b of connection apparatus 11. Connection terminals 16a and 16b of connecting apparatus 11 are formed with an elastic conductive member and are formed in a spring structure.

Connection terminals 15a and 15b of antenna body 10 and connection terminals 16a and 16b of connecting apparatus 11 are arranged on hard window glass 17 such that connection terminals 15a and 15b and connection terminals 16a and 16b overlap, and are fixed on window glass 17 using adhesive, for example. By this means, connection terminals 16a and 16b of connecting apparatus 11 are pressed by the spring structure and contact physically, leading to a conduction state.

Figure 2:
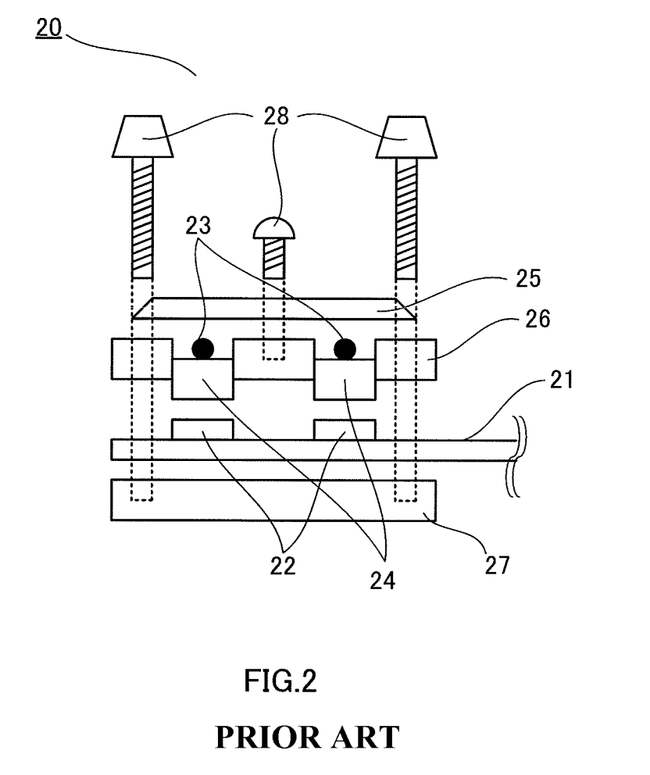
FIG. 2 shows a configuration of the antenna apparatus disclosed in Patent Literature 2 which is prior art.

Further, as another example of a power feeding structure, the antenna apparatus disclosed in Patent Literature 2 has been proposed, for example. FIG. 2 shows a configuration of the antenna apparatus disclosed in Patent Literature 2. Antenna apparatus 20 is configured such that antenna pattern 22 formed on film 21 and power feed line 23 are sandwiched by hard cover 25, hard front cover plate 26, and back cover plate 27, via power feed terminal plate 24, and are pressed together by screw 28 to be electrically conducted.

CITATION LIST

Patent Literature

PTL1
Japanese Patent Application Laid-Open No. 2000-196327
PTL2
Japanese Patent Application Laid-Open No. 63-254804

SUMMARY OF INVENTION

Technical Problem

However, the antenna apparatus disclosed in Patent Literature 1 presumes pasting a transparent film, on which transparent conductive material is formed, on hard glass, and fixing connection terminals of an antenna element, and requires a lot of parts, such as a power feed line, a connecting apparatus for fixing connection terminals via a power feed substrate, and spring-shaped connection terminals. For these reasons, the antenna apparatus disclosed in Patent Literature 1 has problems with a complicated structure and a large power feed section that cannot be miniaturized. Further, there is another problem that, when a connection terminal of an antenna element and a connection terminal of a connecting apparatus contact, only one side of each connection terminal makes a contact surface, making it difficult to reduce contact resistance.

Further, the antenna apparatus disclosed in Patent Literature 2 is structured to sandwich an antenna element and a power feed line by a hard cover, a front cover plate, and a back cover plate via a power feed terminal plate, raising problems that the antenna apparatus requires a lot of parts and the structure is complicated, and a power feed section is large and cannot be miniaturized. Further, there is a problem that, as is the case with Patent Literature 1, only one side of the antenna element and the power feed line becomes a contact surface upon connection, making it difficult to reduce contact resistance.

It is therefore an object of the present invention to provide an antenna apparatus that is small and simple, and that reduces contact resistance when connecting a film-like antenna element and a power feed section.

Solution to Problem

An antenna apparatus comprising: a conductive power feed line; a film-like insulation base material that has a predetermined optical transmittance; and an antenna element that is formed with a conductive material having a predetermined optical transmittance on one surface of the insulation base material, folded together with the insulation base material to place the conductive material inside and sandwich an end of the power feed line, and electrically connected with the power feed line.

Advantageous Effects of Invention

According to the present invention, it is possible to realize an antenna apparatus that is small and simple, and that reduces contact resistance when connecting a film-like antenna element and a power feed section.

DESCRIPTION OF EMBODIMENTS

Now, embodiments of the present invention will be described in detail with reference to the accompanying drawings. However, components having the same functions in the embodiments will be assigned the same reference numerals, and overlapping explanations will be omitted.

Embodiment 1

Figure 3:
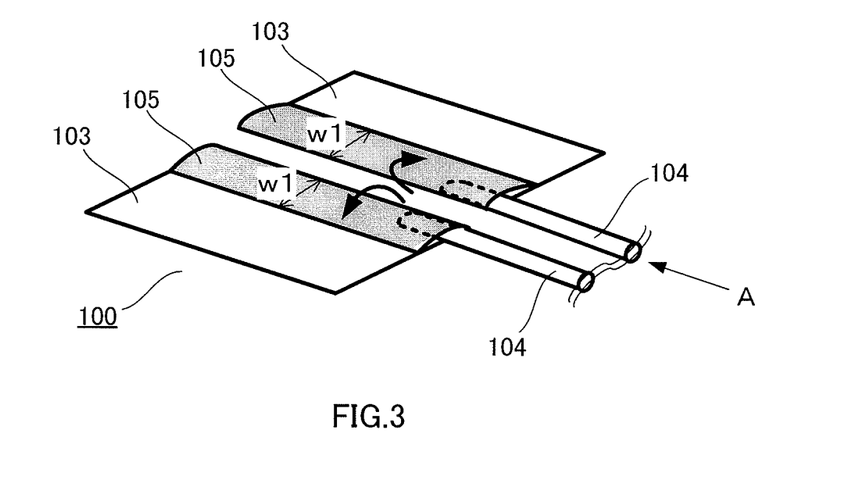
FIG. 3 shows a configuration of the antenna apparatus according to Embodiment 1 of the present invention.

FIG. 3 shows a configuration of antenna apparatus 100 according to Embodiment 1 of the present invention. Antenna apparatus 100 comprises: non-conductive transparent film 101, which is an insulation base material having an optical transmittance of, for example, 90%; antenna element 103, which is formed with transparent conductive material 102 having an optical transmittance of, for example, 80%; and non-transparent, conductive power feed line 104.

In part of one side of antenna element 103 constituting a rectangular dipole antenna, transparent film 101 and transparent conductive material 102 are folded and pressed together, placing conductive material 102 inside and sandwiching one end of power feed line 104.

Figure 4:
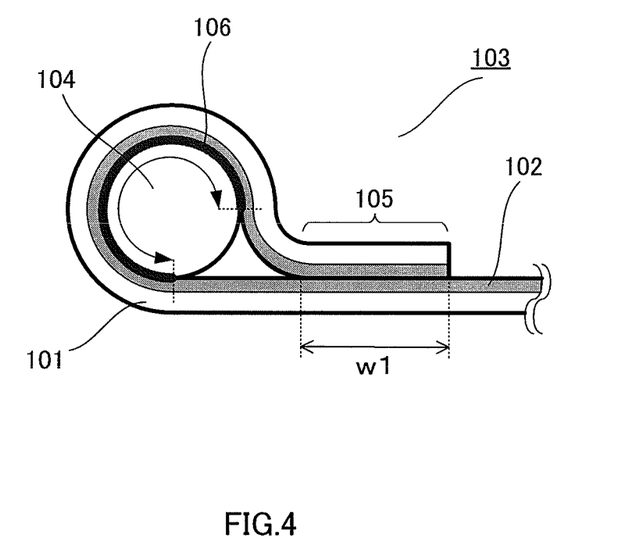
FIG. 4 shows the view of the antenna element in FIG. 3 seen in the direction of arrow A.

FIG. 4 shows a view of the antenna element in FIG. 3 seen in the direction of arrow A. By being folded, transparent conductive material 102 has overlapping parts 105, electrically connected with each other and having a width of w1. Conductive adhesive is applied to overlapping parts 105 and contact surface 106 where transparent conductive material 102 and power feed line 104 contact, so that power feed line 104 and transparent conductive material 102 are electrically connected and mechanically fixed.

As shown in FIG. 4, when power feed line 104 is formed in a cylindrical shape, almost the entirety of the circumference of the section of the power feed line contacts transparent conductive material 102. As a result of this, compared to the case where part of the circumference of the section of the power feed line contacts transparent conductive material 102, it is possible to enlarge the area of contact surface 106 where antenna element 103 and power feed line 104 contact, and therefore reduce contact resistance. By this means, it is possible to improve the antenna radiation efficiency, and realize high antenna performance.

Figure 5:
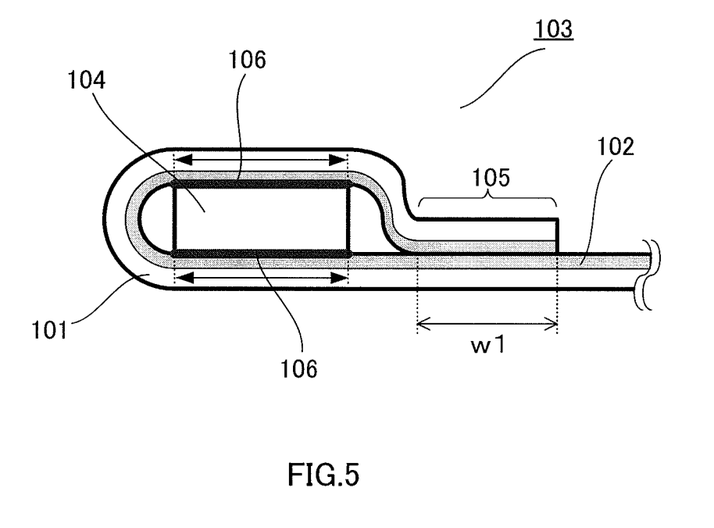
FIG. 5 shows a case where a cross section of the power feed line is flat.

Even when a cross section of the power feed line is flat, for example, as shown in FIG. 5, it is possible to make contact surface 106 two-sided, and therefore reduce contact resistance.

Further, generally, the antenna current is the highest in the vicinity of a power feed section, and therefore it is possible to improve antenna performance by lowering the resistance value in the power feed section.

According to the present embodiment, by providing overlapping parts 105 where parts of transparent conductive material 102 overlap each other over a width of w1, it is possible to double the thickness of transparent conductive material 102 and reduce the resistance value of the transparent conductive material to a half. For example, when determining the radiation efficiency of a square dipole antenna of 950 MHz using a transparent conductive material having a sheet resistance of 1 ohm per square, the radiation efficiency is −1.6 dB when width w1 of overlapping parts 105 is 0 mm (i.e. when antenna element 103 is not folded). By contrast, the radiation efficiency is −1 dB when width w1 of overlapping parts 105 is 4 mm (0.013 wavelength), achieving an improvement by 0.6 dB. As described above, it is possible to significantly improve the radiation efficiency by providing overlapping parts 105 having about a 0.01 wavelength.

As described above, according to Embodiment 1, part of an antenna element, which is formed with a transparent conductive material on one surface of a film element, is folded to place the transparent conductive material inside and sandwich an end of a power feed line. By this means, it is possible to enlarge the contact area of the transparent conductive material and the power feed line, consequently reducing contact resistance and improving the antenna radiation efficiency. Further, by providing overlapping parts to be electrically connected with each other when a transparent conductive material is folded, it is possible to lower the resistance value of the transparent conductive material in the vicinity of a power feed section, where the density of antenna current is high, and improve the antenna radiation efficiency. Further, parts for fixing an antenna element and a power feed line are not necessary, so that it is possible to realize a simpler power feeding structure and a smaller antenna apparatus. Further, by fixing a power feed line and a transparent conductive material using conductive adhesive, it is possible to realize reliable power feeding with sufficient strength to prevent the transparent conductive material from being peeled off, for example.

Embodiment 2

Figure 6:
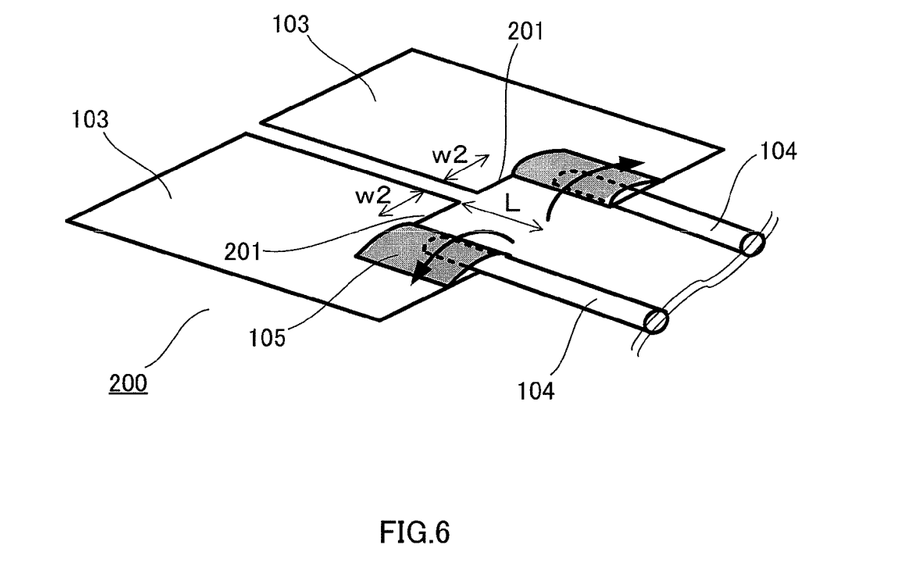
FIG. 6 shows a configuration of the antenna apparatus according to Embodiment 2 of the present invention.

FIG. 6 shows a configuration of antenna apparatus 200 according to Embodiment 2 of the present invention. In FIG. 6, cut part 201 having a cut width of w2 is provided in antenna element 103 and is formed in the position of length L from an end face of antenna element 103. Transparent film 101 and transparent conductive material 102, covering distance L from an end face of antenna element 103 to cut part 201, are folded and pressed together to place transparent conductive material 102 inside and sandwich an end of power feed line 104.

Now, assume that, for example, the sheet resistance value of a transparent conductive material of a square dipole antenna of 950 MHz is 1 ohm per square, distance L is 32 mm (0.1 wavelength), and width w2 is 5 mm (0.016 wavelength). By this means, the radiation efficiency improves by 0.5 dB, compared to the configuration which provides no cutting and which involves no folding.

With the configuration of the antenna shown in FIG. 6, when width w2 is widened, the space between power-feeding points becomes larger and the operation of the dipole antenna becomes unstable, and therefore it is preferable to set width w2 at 5 mm or less. As for distance L, because a lot of antenna current is distributed around an antenna element, antenna performance will be improved when distance L is longer.

As described above, even when a cut is provided in part of a transparent film and a transparent conductive material and only part in the vicinity of a power feed section is folded, it is possible to improve the radiation efficiency, as is the case with the configuration shown in FIG. 3. Further, compared to the configuration where one side of an antenna element is folded as shown in FIG. 3, it is possible to reduce the size of the fold, ensuring a uniform fold and realizing stable antenna performance.

As described above, according to Embodiment 2, a cut is provided in part of an antenna element formed with a transparent film and a transparent conductive material, and, in that cut part, the transparent film and the transparent conductive material are folded to place the transparent conductive material inside and sandwich an end of a power feed line. By this means, it is possible to improve the radiation efficiency and reduce the size of the fold, ensuring a uniform fold and realizing stable antenna performance.

Embodiment 3

Figure 7:
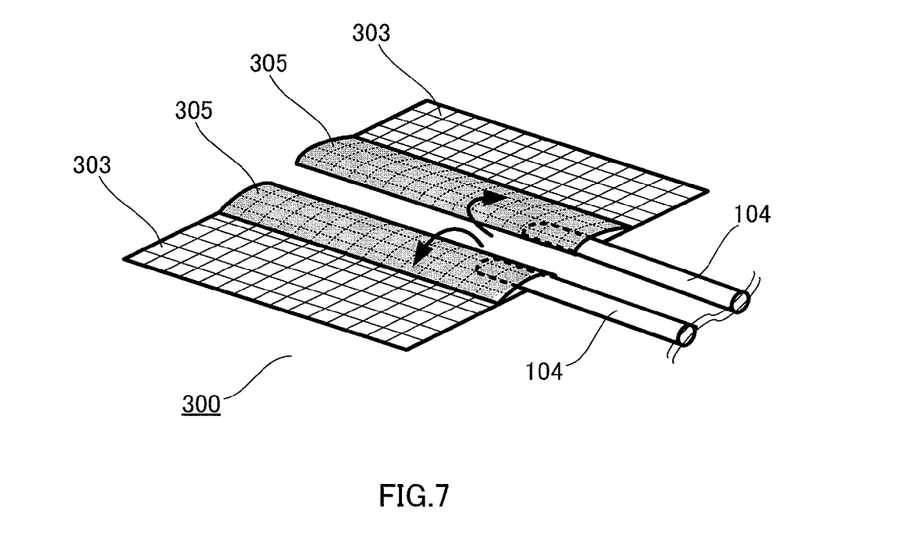
FIG. 7 shows a configuration of the antenna apparatus according to Embodiment 3 of the present invention.

FIG. 7 shows a configuration of antenna apparatus 300 according to Embodiment 3 of the present invention. In FIG. 7, antenna apparatus 300 comprises: non-conductive transparent film 101, antenna element 303 formed on transparent film 101, and non-transparent, conductive power feed line 104.

Figure 8A:
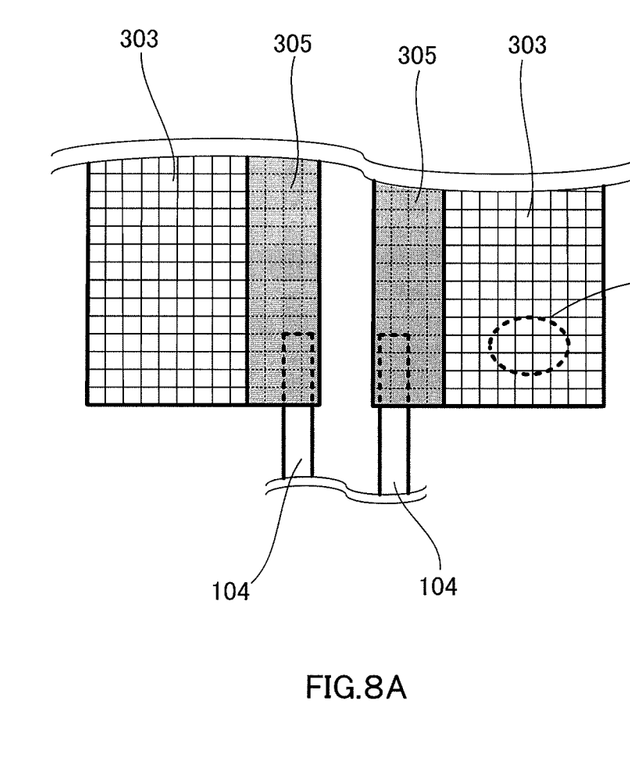
FIGS. 8A and 8B show a configuration of the non-transparent metal conductors in FIG. 7.
Figure 8B:
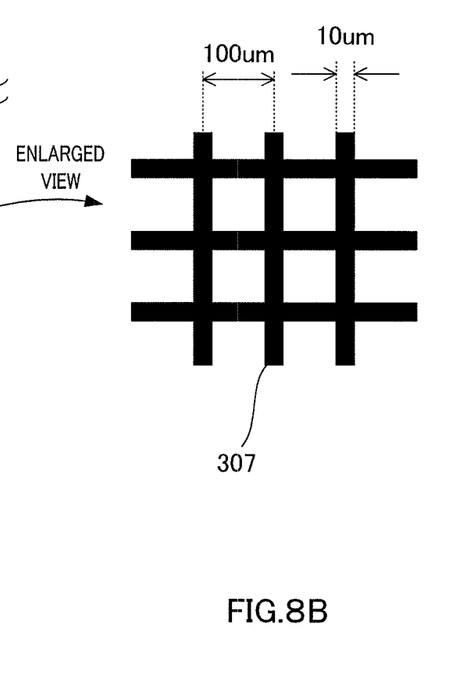

Antenna element 303 constitutes a rectangular dipole antenna, in which, for example, super-thin, non-transparent metal conductors 307 having a width of 10 μm are arranged at 100 μm intervals in a mesh pattern with grids, as shown in FIGS. 8A and 8B. As described above, by increasing a mesh interval compared to the width of a conductor, it is possible to configure an antenna element having a higher optical transmittance. For example, when the opening area of conductors is one tenth of the opening area of the non-conductive part, the transmittance will be 90%

Further, in part of one side of antenna element 303, transparent film 101 and antenna element 303 are folded and pressed together to place non-transparent metal conductors 307 inside and sandwich an end of power feed line 104. In this case, non-conductive metal conductors 307 have overlapping parts 305 to be electrically connected with each other, and these overlapping parts 305 are pressed together such that the mesh pattern matches itself (that is, the conductors overlap each other). Because the mesh pattern is a periodic geometric pattern, it is possible to make the pattern match itself in overlapping parts 305. Further, conductive adhesive is applied to overlapping parts 305 and the contact surface where non-transparent metal conductors 307 and power feed line 104 contact, so that power feed line 104 and non-transparent metal conductors 307 are electrically connected.

As described above, according to Embodiment 3, given an antenna element formed by arranging super-thin, non-transparent metal conductors in a mesh pattern with grids, part of this antenna element and transparent film is folded to place the non-transparent metal conductors inside and sandwich an end of a power feed line, so that, in overlapping parts where the non-transparent metal conductors are electrically connected with each other, and the mesh pattern matches itself. By this means, it is possible to suppress the decrease of optical transmittance in the overlapping parts. Further, it is possible to enlarge the contact area where the non-transparent metal conductors and the power feed line contact, reducing contact resistance and improving the antenna radiation efficiency.

Although a case has been described with the above embodiment as an example where a transparent conductive material is formed with a mesh pattern of non-transparent metal conductors, the present invention is by no means limited to this, and it is equally possible to use a periodic geometric pattern such as stripe.

Although a case has been described with the above embodiment as an example where the width of each non-transparent metal conductor is 10 μm and the interval of the non-transparent metal conductor is 100 μm, the present invention is by no means limited to this, and it is equally possible to adopt any configuration with which an optical transmittance is obtained.

Embodiment 4

Figure 9A:
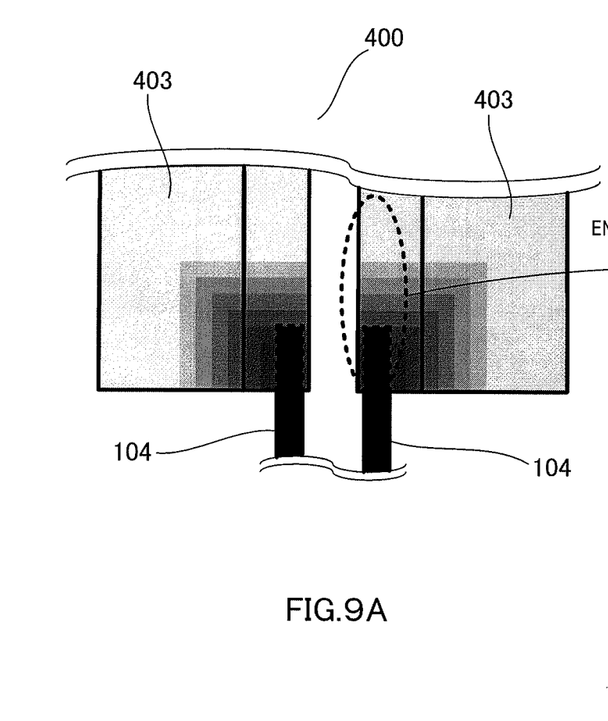
FIGS. 9A and 9B show a configuration of the antenna apparatus according to Embodiment 4 of the present invention.
Figure 9B:
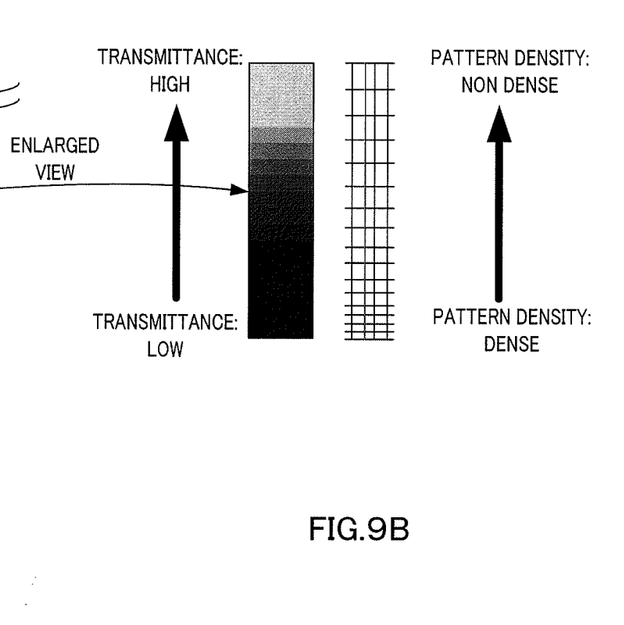

FIGS. 9A and 9B show a configuration of antenna apparatus 400 according to Embodiment 4 of the present invention. In FIGS. 9A and 9B, antenna apparatus 400 comprises: non-conductive transparent film 101, antenna element 403 formed on transparent film 101, and non-transparent, conductive power feed line 104.

Antenna element 403 comprises non-transparent metal conductors 307 that are configured such that mesh pattern density is set higher in the vicinity of a connection with power feed line 104, while the pattern density is set lower gradually where the distance from the vicinity of the power feed section is longer. In this case, although the pattern density is set to become lower linearly or exponentially, for example, there is almost no influence on the radiation efficiency depending on the difference of change of the pattern density. Therefore, it is possible to obtain equivalent antenna performance in any configurations.

As described above, according to Embodiment 4, by increasing the density of a mesh pattern formed with non-transparent metal conductors in the vicinity of a power feed section, it is possible to facilitate the non-transparent metal conductors to contact a power feed line, and it is also possible to enlarge contact area where the power feed line and the non-transparent metal conductors contact, consequently decreasing contact resistance. Further, by gradually decreasing the mesh pattern density where the distance from the power feed section is longer, it is possible to increase the optical transmittance gradually from the vicinity of the power feed section and prevent local changes of transmittance, making the vicinity of the power feed section less distinguishable.

Although cases have been described with the above embodiments as examples where the antenna element constitutes a rectangular dipole antenna, the present invention is by no means limited to this, and it is equally possible to use any antenna elements as long as it is configured with a transparent conductive material formed on a non-conductive transparent film.

Further, the present invention is by no means limited to the configuration parameter according to the above embodiments, and it is equally possible to set a configuration parameter so as to improve the antenna radiation efficiency.

The disclosure of Japanese Patent Application No. 2009-242575, filed on Oct. 21, 2009, including the specification, drawings and abstract, is incorporated herein by reference in its entirety.

INDUSTRIAL APPLICABILITY

The antenna apparatus according to the present invention has an effect of not impairing view and design, and is suitable for use in window glass for vehicles and stores, for example.

REFERENCE SIGNS LIST

101 Transparent film
102 Transparent conducive material
103, 303, 403 Antenna element

104 Power feed line
105, 305 Overlapping parts
201 Cut part
307 Non-transparent metal conductor

The invention claimed is:

1. An antenna apparatus comprising:
a conductive power feed line;
a film-like insulation base material that has a predetermined optical transmittance; and
an antenna element that is formed with a conductive material having a periodic geometric pattern structure with a predetermined optical transmittance on one surface of the insulation base material, folded together with the insulation base material to place the conductive material inside and sandwich an end of the power feed line, and electrically connected with the power feed line such that the geometrical pattern matches itself in overlapping parts where the conductive material matches itself over a predetermined range.

2. The antenna apparatus according to claim 1, wherein the antenna element is formed with the conductive material such that a pattern density of the geometric pattern is set higher in a part to connect with the power feed line, and is set lower following an increase of a distance from the part to connect with the power feed line.

* * * * *